(12) United States Patent
Shirahama et al.

(10) Patent No.: US 12,362,332 B2
(45) Date of Patent: Jul. 15, 2025

(54) SEMICONDUCTOR DEVICE

(71) Applicant: Mitsubishi Electric Corporation, Tokyo (JP)

(72) Inventors: Ryoya Shirahama, Tokyo (JP); Arata Iizuka, Tokyo (JP); Korehide Okamoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 456 days.

(21) Appl. No.: 17/997,806

(22) PCT Filed: Jul. 29, 2020

(86) PCT No.: PCT/JP2020/029020
§ 371 (c)(1),
(2) Date: Nov. 2, 2022

(87) PCT Pub. No.: WO2022/024250
PCT Pub. Date: Feb. 3, 2022

(65) Prior Publication Data
US 2023/0163106 A1    May 25, 2023

(51) Int. Cl.
*H01L 25/07* (2006.01)
*H01L 23/051* (2006.01)
(Continued)

(52) U.S. Cl.
CPC ........ *H01L 25/074* (2013.01); *H01L 23/3735* (2013.01)

(58) Field of Classification Search
CPC . H01L 23/3735; H01L 23/473; H01L 23/051; H01L 25/074; H01L 2224/33181
See application file for complete search history.

(56) References Cited

U.S. PATENT DOCUMENTS

| 2012/0228757 A1* | 9/2012 | Kitami | .................... H01L 23/36 257/713 |
| 2013/0015591 A1* | 1/2013 | Haba | ................... H01L 25/0652 257/E23.141 |

(Continued)

FOREIGN PATENT DOCUMENTS

JP    2013-038105 A    2/2013

OTHER PUBLICATIONS

International Search Report issued in PCT/JP2020/029020; mailed Oct. 27, 2020.

*Primary Examiner* — Omar F Mojaddedi
(74) *Attorney, Agent, or Firm* — Studebaker Brackett PLLC

(57) ABSTRACT

An object of the present invention is to provide a technique capable of reducing a gap between a first semiconductor device and a second semiconductor device that are bonded. At least one of a pair of a first electrode of the first semiconductor device and a second electrode of the second semiconductor device and a pair of a second electrode of the first semiconductor device and a first electrode of the second semiconductor device is electrically connected, and for each of the first semiconductor device and the second semiconductor device, each of a thickness of a portion from a first connected portion to a second connected portion and a thickness of a holding member are equal to or less than a thickness of a first main body portion or a thickness of a second main body portion.

17 Claims, 19 Drawing Sheets

(51) Int. Cl.
  *H01L 23/373* (2006.01)
  *H01L 23/473* (2006.01)

(56) References Cited

U.S. PATENT DOCUMENTS

| | | | |
|---|---|---|---|
| 2014/0328015 A1* | 11/2014 | Crisp | H01L 23/49838 |
| | | | 361/679.32 |
| 2016/0027711 A1* | 1/2016 | Harada | H01L 23/49827 |
| | | | 257/698 |
| 2016/0260691 A1* | 9/2016 | Aoshima | H01L 23/48 |
| 2019/0259690 A1* | 8/2019 | Kawashima | H01L 23/49575 |

\* cited by examiner

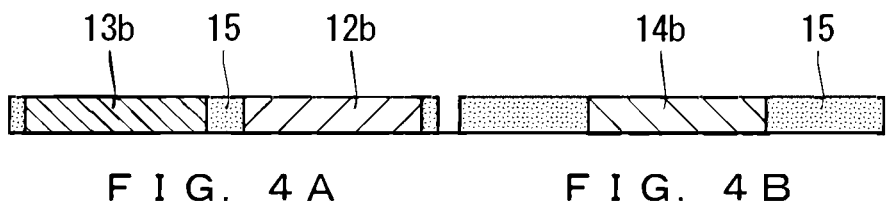
F I G. 4 A    F I G. 4 B

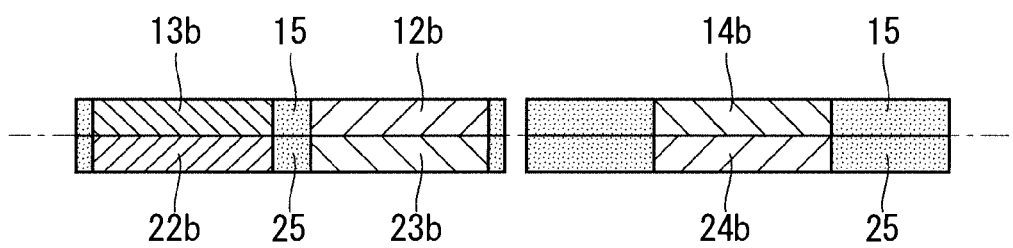
F I G. 9 A    F I G. 9 B

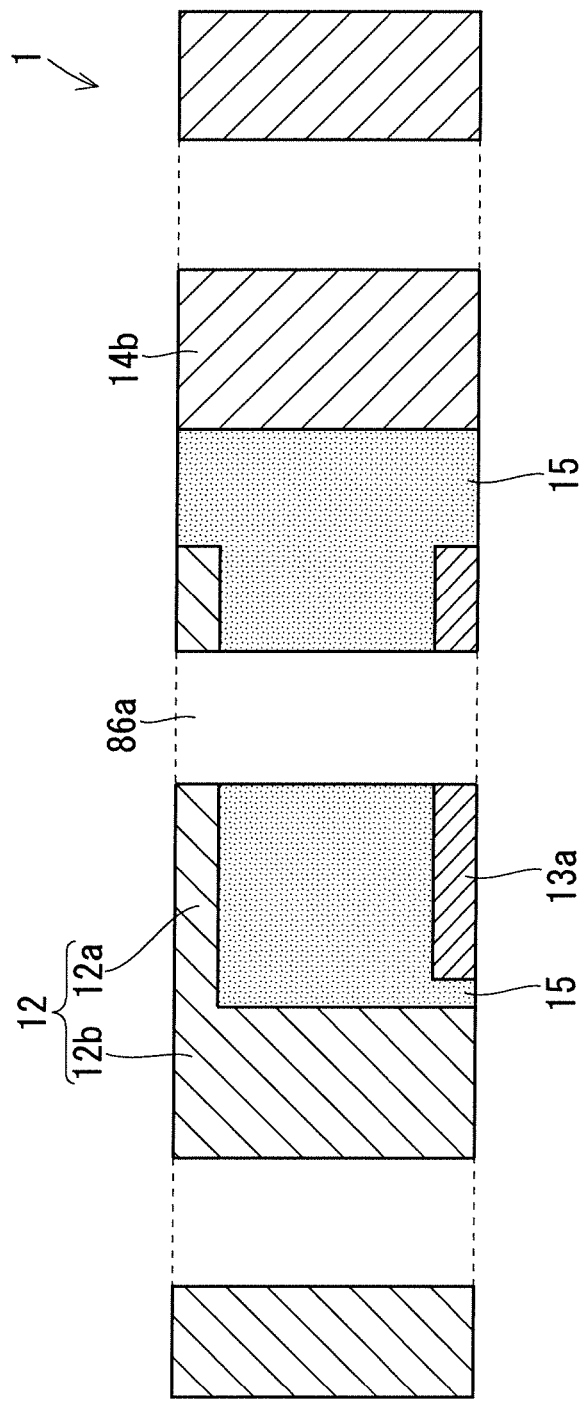

SEMICONDUCTOR DEVICE

TECHNICAL FIELD

The present invention relates to a semiconductor device.

BACKGROUND ART

In a semiconductor device such as a power semiconductor device or the like, a technique in which a plurality of modules each having one arm are prepared and bonded to configure one module having a plurality of arms has been proposed (for example, Patent Document 1). Note that one module having one arm may also be referred to as a single function module, a single-phase module, a 1-in-1 module, or the like. One module having a plurality of arms may be, for example, a 2-in-1 module, a 6-in-1 module, or the like. According to the technique such as is disclosed in the above-described Patent Document 1, the semiconductor device can be miniaturized.

PRIOR ART DOCUMENT

Patent Document

Patent Document 1: Japanese Patent Application Laid-Open No. 2013-038105

SUMMARY

Problem to be Solved by the Invention

However, in the prior art, since an entire sealing member holding a semiconductor element is relatively thick, a gap is created between electrodes of the plurality of bonded single function modules. As a result, there was a problem in which ease of assembly and miniaturization of the semiconductor device are reduced.

Thereupon, the present disclosure has been made in view of the above problems, and an object thereof is to provide a technique capable of reducing a gap between a first semiconductor device and a second semiconductor device that are bonded.

Means to Solve the Problem

A semiconductor device according to the present disclosure includes a first semiconductor device and a second semiconductor device capable of being bonded, in which each of the first semiconductor device and the second semiconductor device includes a semiconductor element, a first electrode having a first connected portion disposed on a first side in a vertical direction, which is a bonding direction of the first semiconductor device and the second semiconductor device, with respect to the semiconductor element, and connected to the semiconductor element, and a first main body portion disposed laterally of the semiconductor element and connected to the first connected portion, a second electrode having a second connected portion disposed on a second side in the vertical direction with respect to the semiconductor element and connected to the semiconductor element, and a second main body portion disposed laterally of the semiconductor element and connected to the second connected portion, and a holding member that holds the semiconductor element, the first electrode, and the second electrode, and exposes a surface of the first electrode on the first side and a surface of the second electrode on the second side, at least one of a pair of the first electrode of the first semiconductor device and the second electrode of the second semiconductor device, and a pair of the second electrode of the first semiconductor device and the first electrode of the second semiconductor device, is electrically connected, and for each of the first semiconductor device and the second semiconductor device, each of a thickness of a portion from the first connected portion to the second connected portion and a thickness of the holding member are equal to or less than a thickness of the first main body portion or a thickness of the second main body portion.

Effects of the Invention

According to the present disclosure, at least one of a pair of a first electrode of a first semiconductor device and a second electrode of a second semiconductor device and a pair of a second electrode of the first semiconductor device and a first electrode of the second semiconductor device is electrically connected, and for each of the first semiconductor device and the second semiconductor device, each of a thickness of a portion from a first connected portion to a second connected portion and a thickness of a holding member are equal to or less than a thickness of a first main body portion or a thickness of a second main body portion. According to such a configuration, it is possible to reduce a gap between the first semiconductor device and the second semiconductor device that are bonded.

Objects, features, aspects, and advantages of the present disclosure will become more apparent from the following detailed description and the accompanying drawings.

BRIEF DESCRIPTION OF DRAWINGS

FIGS. 4A and 4B are side views illustrating a configuration of the first semiconductor device according to the first embodiment.

FIGS. 9A and 9B are side views illustrating a configuration in which one first semiconductor device and one second semiconductor device are bonded according to the first embodiment.

FIG. 16 is a cross-sectional view illustrating a configuration of a first semiconductor device according to a thirteenth embodiment.

DESCRIPTION OF EMBODIMENTS

Figure 1:
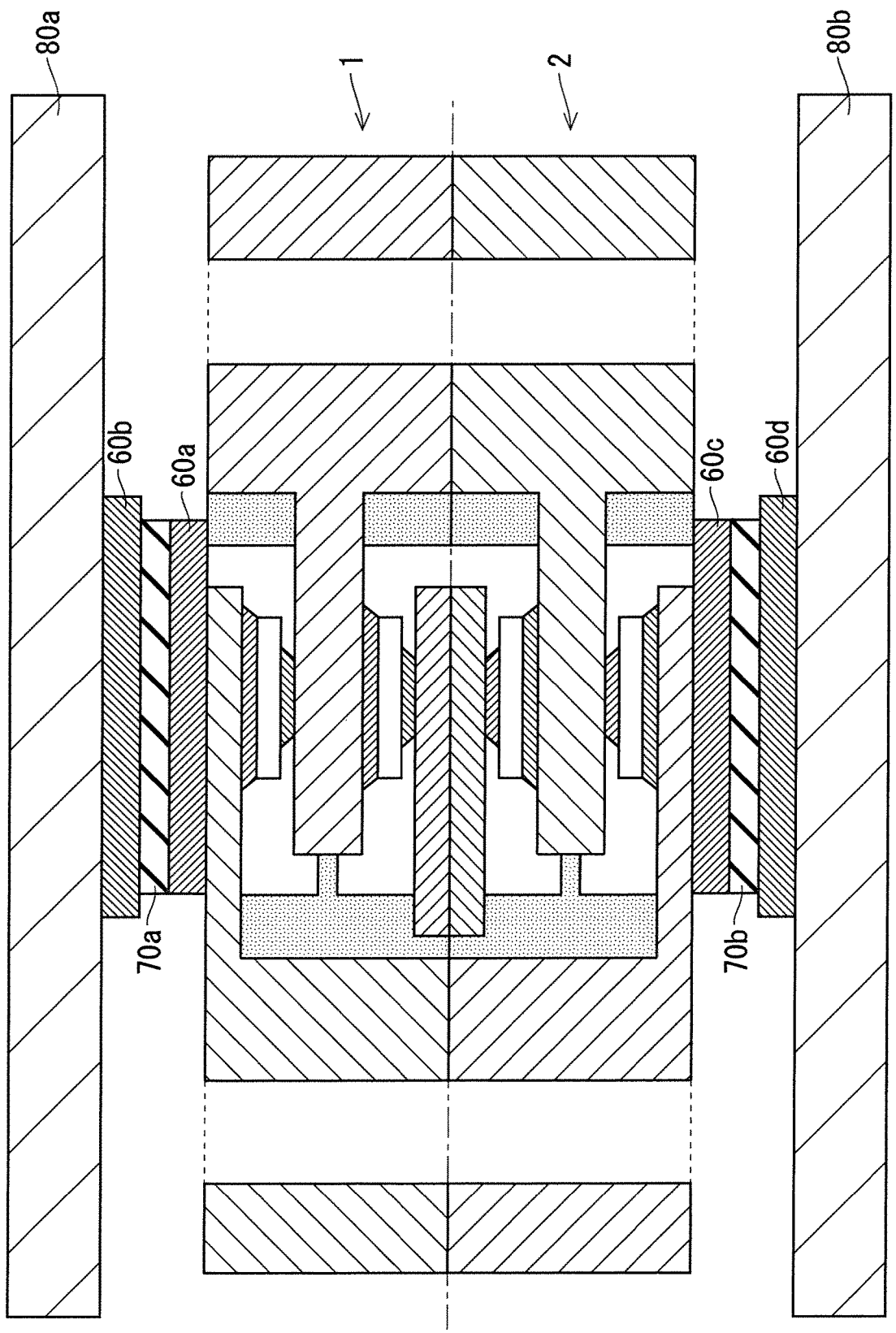
FIG. 1 is a cross-sectional view illustrating a configuration of a semiconductor device according to a first embodiment.

Hereinafter, embodiments will be described with reference to the accompanying drawings. Features described in each of the following embodiments are examples, and not all features are necessarily essential. Furthermore, in the following description, similar constituent elements in a plurality of embodiments are denoted by the same or similar reference numerals, and different constituent elements will mainly be described. In addition, in the following description, a specific position and direction, such as "upper", "lower", "left", "right", "front", or "back" may not necessarily coincide with a direction during actual implementation.

First Embodiment

FIG. 1 is a cross-sectional view illustrating a configuration of a semiconductor device according to a first embodiment. The semiconductor device according to the first embodiment includes a first semiconductor device 1 and a second semiconductor device 2 capable of being bonded, greases 60a, 60b, 60c, and 60d, insulating plates 70a and 70b, and cooling fins 80a and 80b.

As will be described in detail later, each of the first semiconductor device 1 and the second semiconductor device 2 according to the first embodiment is a 2-in-1 module. Therefore, the semiconductor device in FIG. 1 in which one first semiconductor device 1 and one second semiconductor device 2 are bonded is a 4-in-1 module. Hereinafter, the invention will be described with a bonding direction of the first semiconductor device 1 and the second semiconductor device 2 being a vertical direction, and a lateral corresponding to a direction orthogonal to the vertical direction.

The insulating plate 70a is disposed on an upper surface, which is a first side in the vertical direction, of the first semiconductor device 1 and the second semiconductor device 2 bonded, via the grease 60a. The cooling fin 80a is disposed on the upper surface of the insulating plate 70a via the grease 60b.

The insulating plate 70b is disposed on a lower surface, which is a second side in the vertical direction, of the first semiconductor device 1 and the second semiconductor device 2 bonded, via the grease 60c. The cooling fin 80b is disposed on the lower surface of the insulating plate 70b via the grease 60d.

Note that in FIG. 1, the greases, the insulating plates, and the cooling fins are disposed on each of the upper surface and the lower surface of the first semiconductor device 1 and the second semiconductor device 2, however the greases, the insulating plates, and the cooling fins may be disposed on one of the surfaces only.

Figures 2A, 2B:
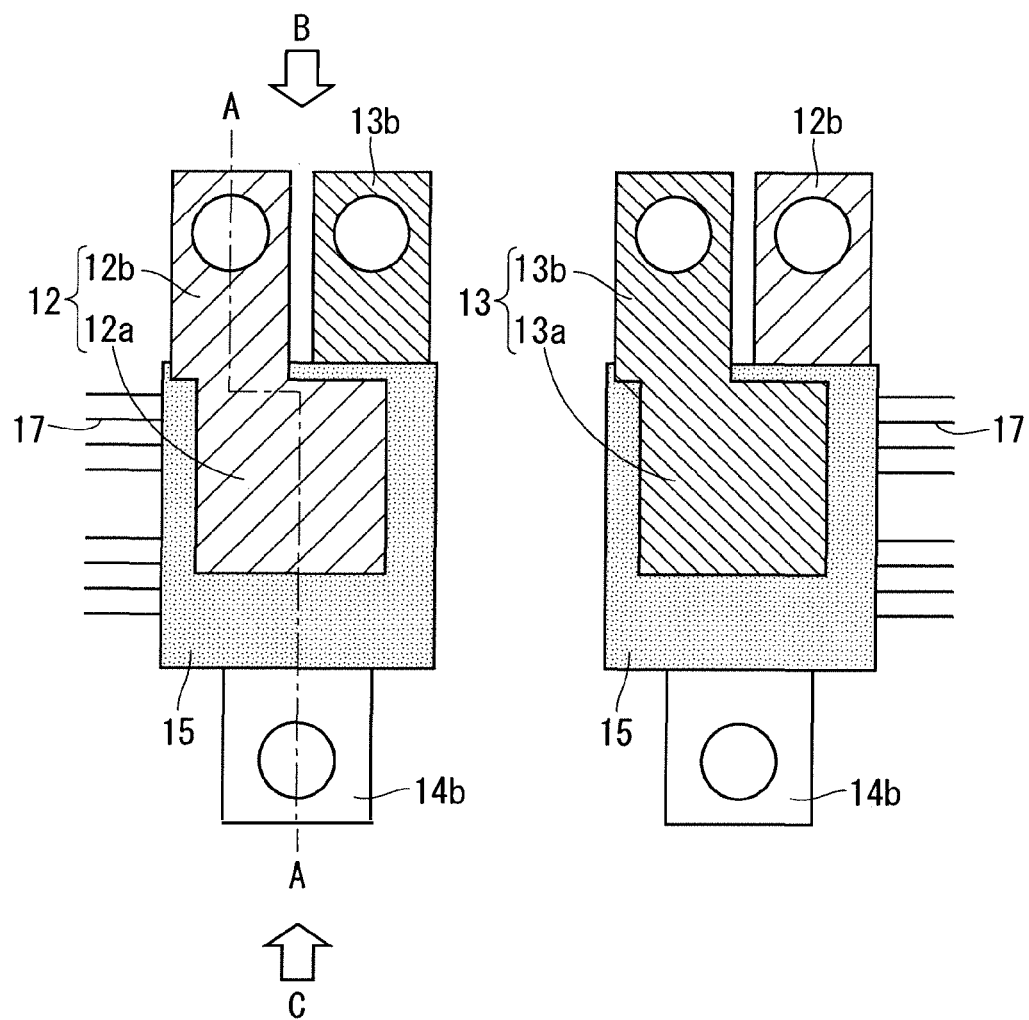
FIGS. 2A and 2B are plan views illustrating a configuration of a first semiconductor device according to the first embodiment.
Figure 3:
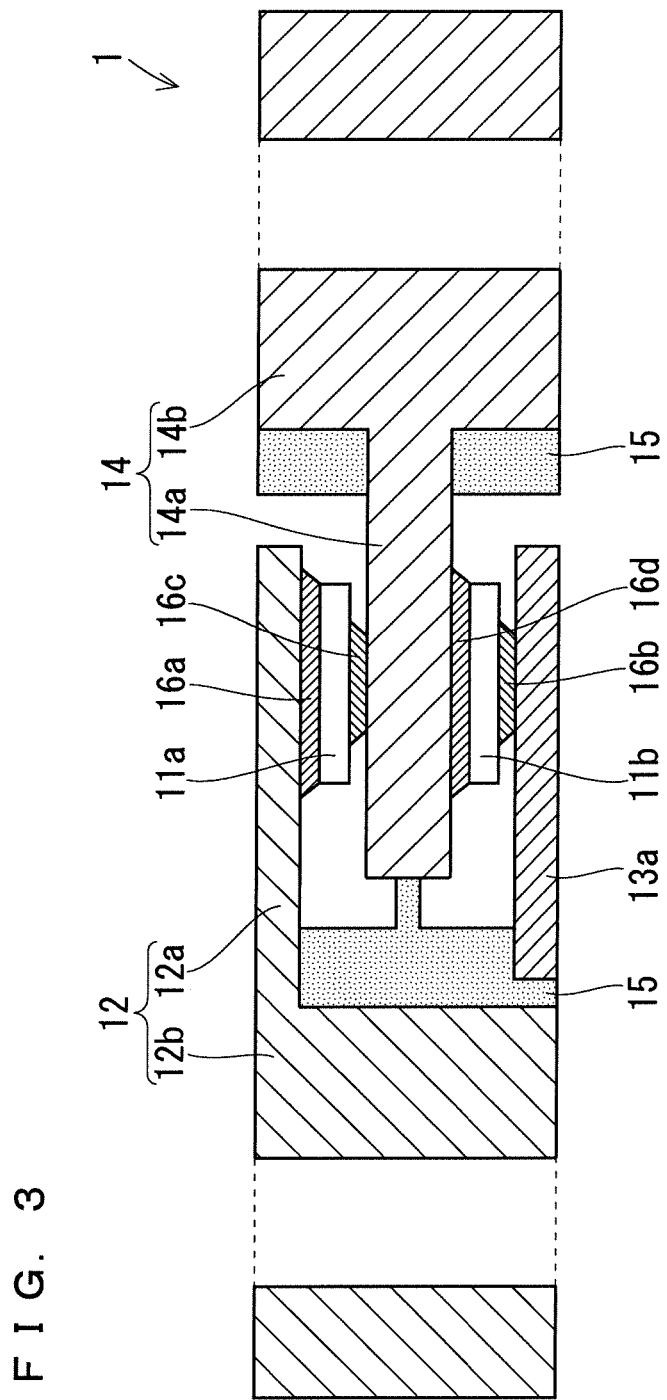
FIG. 3 is a cross-sectional view illustrating a configuration of a first semiconductor device according to the first embodiment.

FIGS. 2A and 2B are plan views illustrating a configuration of the first semiconductor device 1 according to the first embodiment, FIG. 3 is a cross-sectional view illustrating the configuration, and FIGS. 4A and 4B are side views illustrating the configuration. Specifically, FIG. 2A plan view of the first semiconductor device 1 as viewed from the upper surface, and FIG. 2B plan view of the first semiconductor device 1 as viewed from the lower surface. FIG. 3 is a cross-sectional view along line A-A of FIG. 2A. FIG. 4A side view as viewed from a direction B in FIG. 2A, and FIG. 4B side view as viewed from a direction C in FIG. 2A.

As illustrated in FIGS. 2A and 2B, the first semiconductor device 1 includes a P main electrode 12, an N main electrode 13, and a sealing member 15, and as illustrated in FIG. 3, it includes semiconductor elements 11a and 11b, an output terminal 14, and brazing materials 16a, 16b, 16c, and 16d.

The semiconductor elements 11a and 11b include, for example, at least one of a semiconductor switching element and a diode of a power semiconductor element. The semiconductor switching element is, for example, an insulated gate bipolar transistor (IGBT), a metal oxide semiconductor field effect transistor (MOSFET), or the like. The diode is, for example, a Schottky barrier diode (SBD), a PN junction diode (PND), or the like. Furthermore, in the first embodiment, the number of semiconductor elements 11a and 11b is two, however the present invention is not limited hereto.

The P main electrode 12, which is a first electrode, is formed of a conductor such as aluminum (Al) or copper (Cu) and as illustrated in FIG. 2A, has a P connected portion 12a, which is a first connected portion, and a P main body portion 12b, which is a first main body portion. As illustrated in FIG. 3, the P connected portion 12a is disposed on the upper side with respect to semiconductor elements 11a and 11b and is connected to the semiconductor element 11a by the brazing material 16a. The P main body portion 12b is disposed laterally of the semiconductor elements 11a and 11b, is connected to the P connected portion 12a, and is thicker than the P connected portion 12a.

The N main electrode 13, which is a second electrode, is formed of the same conductor as the P main electrode 12, as illustrated in FIG. 2B, and has an N connected portion 13a, which is a second connected portion, and an N main body portion 13b, which is a second main body portion. As illustrated in FIG. 3, the N connected portion 13a is disposed on a lower side with respect to the semiconductor elements 11a and 11b and is connected to the semiconductor element 11b by the brazing material 16b. The N main body portion 13b is disposed laterally of the semiconductor elements 11a and 11b in the same way to the P main body portion 12b in FIG. 3, is connected to the N connected portion 13a, and is thicker than the N connected portion 13a.

The output terminal 14 is formed of the same conductor as the P main electrode 12, and as illustrated in FIG. 3, has an output connected portion 14a, which is a third connected portion, and an output main body portion 14b, which is a third body portion. The output connected portion 14a is disposed between the semiconductor elements 11a and 11b and is connected to the semiconductor elements 11a and 11b by the brazing materials 16c and 16d. The output main body portion 14b is disposed laterally of the semiconductor elements 11a and 11b, is connected to the output connected portion 14a, and is thicker than the output connected portion 14a.

The sealing member 15, which is a holding member, is formed of, for example, resin, holds the semiconductor elements 11a and 11b, the P main electrode 12, the N main electrode 13, and the output terminal 14, and exposes the upper surface of the P main electrode 12 and the lower surface of the N main electrode 13. As illustrated in FIGS. 2A and 2B, in the first embodiment, the P main body portion 12b, the N main body portion 13b, and the output main body portion 14b are mostly exposed from the sealing member 15.

Here, in FIG. 3, a thickness of each of the P main body portion 12b, the N main body portion 13b, and the output main body portion 14b is the same as the thickness of the first semiconductor device 1, and is, for example, 3 mm. A thickness of a constituent element on an inner side of the sealing member 15 is reduced by cutting, rolling, or the like, and is, for example, ⅓ or less of the thickness before reduction. Furthermore, here, the thickness corresponds to a length in the vertical direction, and the same applies to the following description.

As a result, each of a thickness of a portion from the P connected portion 12a to the N connected portion 13a and a thickness of the sealing member 15 are equal to or less than a thickness of the P main body portion 12b, a thickness of the N main body portion 13b, or a thickness of the output main body portion 14b. As an example of the above configuration, FIG. 3 illustrates a configuration in which there is no difference in level between the upper surfaces of each of the P connected portion 12a, the P main body portion 12b, the N main body portion 13b, the output main body portion 14b, and the sealing member 15. Similarly, as an example of the above configuration, FIG. 3 illustrates a configuration in which there is no difference in level between the lower surfaces of each of the N connected portion 13a, the P main body portion 12b, the N main body portion 13b, the output main body portion 14b, and the sealing member 15.

Furthermore, the thickness of the P main body portion 12b, the thickness of the N main body portion 13b, and the thickness of the output main body portion 14b may be different from each other. Even in this case, each of the thickness of the portion from the P connected portion 12a to the N connected portion 13a and the thickness of the sealing member 15 may be equal to or less than the thickness of the P main body portion 12b, the thickness of the N main body portion 13b, or the thickness of the output main body portion 14b.

The first semiconductor device 1 according to the first embodiment includes not only the above constituent elements, but also a signal terminal portion 17 of FIGS. 2A and 2B. The signal terminal portion 17 is connected to the semiconductor elements 11a and 11b by a wire (not illustrated) or the like and protrudes outward from a side portion of the sealing member 15.

As illustrated in FIGS. 2A and 2B, the P main body portion 12b and the N main body portion 13b are disposed adjacent to one other in the plan view, and the output main body portion 14b is disposed on an opposite side to the P main body portion 12b and the N main body portion 13b with respect to the sealing member 15 in the plan view. However, a positional relationship between the P main body portion 12b, the N main body portion 13b, the output main body portion 14b, and the signal terminal portion 17 in the plan view is not limited to the positional relationship illustrated in FIGS. 2A and 2B.

Figures 5A, 5B:
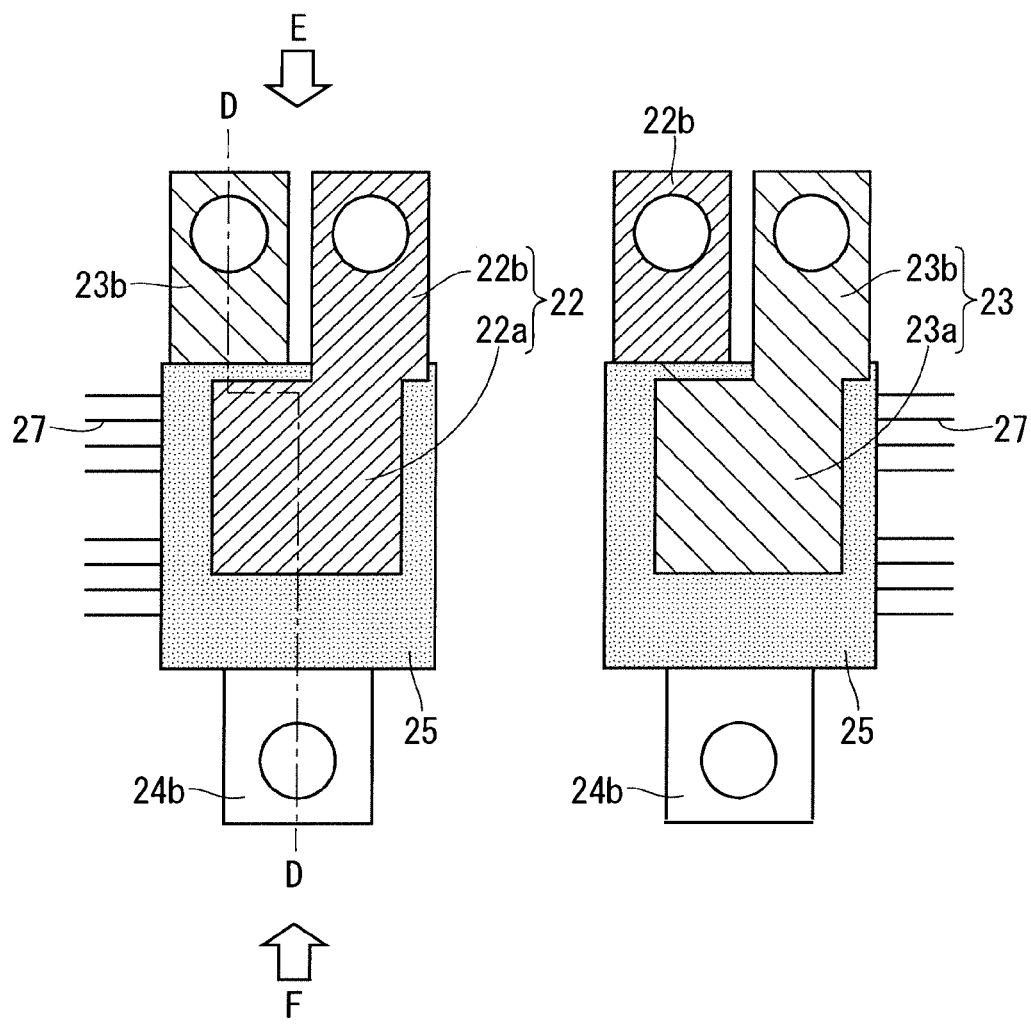
FIGS. 5A and 5B are plan views illustrating a configuration of a second semiconductor device according to the first embodiment.
Figure 6:
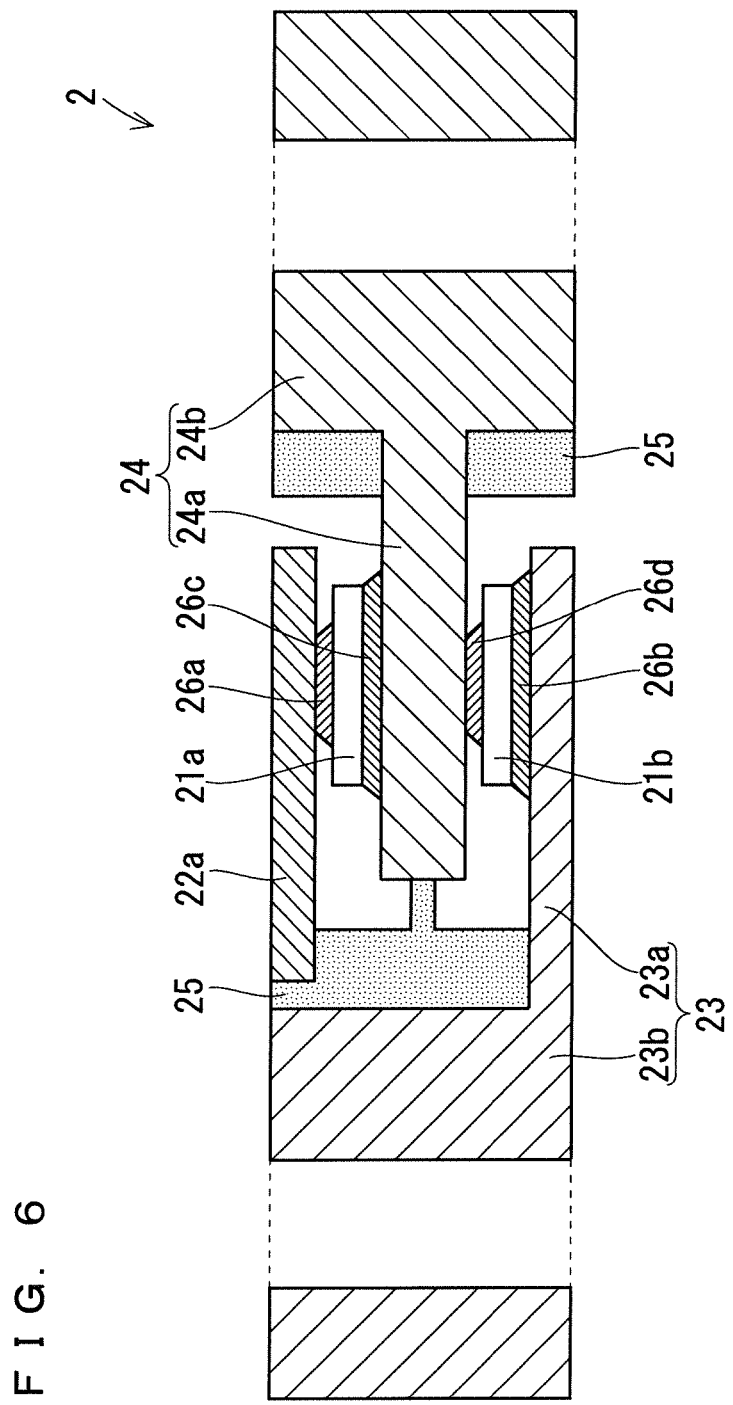
FIG. 6 is a cross-sectional view illustrating a configuration of a second semiconductor device according to the first embodiment.
Figures 7A, 7B:
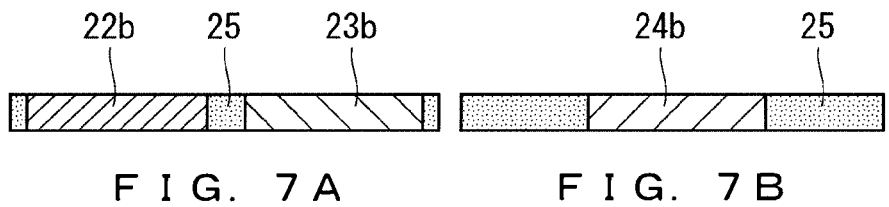
FIGS. 7A and 7B are side views illustrating a configuration of a second semiconductor device according to the first embodiment.

FIGS. 5A and 5B are plan views illustrating a configuration of the second semiconductor device 2 according to the first embodiment, FIG. 6 is a cross-sectional view illustrating the configuration, and FIGS. 7A and 7B are side views illustrating the configuration. Specifically, FIG. 5A plan view of the second semiconductor device 2 as viewed from the upper surface, and FIG. 5B plan view of the second semiconductor device 2 as viewed from the lower surface. FIG. 6 is a cross-sectional view along line D-D of FIG. 5A. FIG. 7A side view as viewed from a direction E in FIG. 5A, and FIG. 7B side view as viewed from a direction F in FIG. 5A.

When describing the outline of the configuration of the second semiconductor device 2, the configuration of the second semiconductor device 2 is vertically symmetrical to the configuration of the first semiconductor device 1. Hereinafter, the second semiconductor device 2 will be described in detail.

As illustrated in FIGS. 5A and 5B, the second semiconductor device 2 includes an N main electrode 22, a P main electrode 23, and a sealing member 25, and as illustrated in FIG. 6, it includes semiconductor elements 21a and 21b, an output terminal 24, and brazing materials 26a, 26b, 26c, and 26d.

The semiconductor elements 21a and 21b are the same as the semiconductor elements 11a and 11b, and include at least one of, for example, a semiconductor switching element and a diode of the power semiconductor element. Furthermore, in the first embodiment, the number of semiconductor elements 21a and 21b is two, however the present invention is not limited hereto.

The N main electrode 22, which is a first electrode, is formed of the same conductor as the P main electrode 12, and as illustrated in FIG. 5A, has an N connected portion 22a, which is a first connected portion, and an N main body portion 22b, which is a first main body portion. As illustrated in FIG. 6, the N connected portion 22a is disposed on an upper side with respect to the semiconductor elements 21a and 21b and is connected to the semiconductor element 21a by the brazing material 26a. The N main body portion 22b is disposed laterally of the semiconductor elements 21a and 21b in the same way as a P main body portion 23b in FIG. 6, is connected to the N connected portion 22a, and is thicker than the N connected portion 22a.

The P main electrode 23, which is a second electrode, is formed of the same conductor as the P main electrode 12, and as illustrated in FIG. 5B, has a P connected portion 23a, which is a second connected portion, and the P main body portion 23b, which is a second main body portion. As shown in FIG. 6, the P connected portion 23a is disposed on a lower side with respect to the semiconductor elements 21a and 21b and is connected to the semiconductor element 21b by the brazing material 26b. The P main body portion 23b is disposed laterally of the semiconductor elements 21a and 21b, is connected to the P connected portion 23a, and is thicker than the P connected portion 23a.

The output terminal 24 is formed of the same conductor as the P main electrode 12, and as illustrated in FIG. 6, has an output connected portion 24a, which is a third connected portion, and an output main body portion 24b, which is a third body portion. The output connected portion 24a is disposed between the semiconductor elements 21a and 21b and is connected to the semiconductor elements 21a and 21b by the brazing materials 26c and 26d. The output main body portion 24b is disposed laterally of the semiconductor elements 21a and 21b, is connected to the output connected portion 24a, and is thicker than the output connected portion 24a.

The sealing member 25, which is a holding member, is formed of, for example, resin, holds the semiconductor elements 21a and 21b, the N main electrode 22, the P main electrode 23, and the output terminal 24, and exposes an upper surface of the N main electrode 22 and a lower surface of the P main electrode 23. As illustrated in FIGS. 5A and 5B, in the first embodiment, the N main body portion 22b, the P main body portion 23b, and the output main body portion 24b are mostly exposed from the sealing member 25.

Here, in FIG. 6, a thickness of each of the N main body portion 22b, the P main body portion 23b, and the output main body portion 24b is the same as a thickness of the second semiconductor device 2, and is, for example, 3 mm. A thickness of a constituent element on an inner side of the sealing member 25 is reduced by cutting, rolling, or the like, and is, for example, ⅓ or less of the thickness before reduction.

As a result, each of the thickness of the portion from the N connected portion 22a to the P connected portion 23a and the thickness of the sealing member 25 is equal to or less than the thickness of the N main body portion 22b, the thickness of the P main body portion 23b, or the thickness of the output main body portion 24b. As an example of the above configuration, FIG. 6 illustrates a configuration in which there is no difference in level between the upper surfaces of each of the N connected portion 22a, the N main body portion 22b, the P main body portion 23b, the output main body portion 24b, and the sealing member 25. Similarly, as an example of the above configuration, FIG. 6 illustrates a configuration in which there is no difference in level between the lower surfaces of each of the P connected portion 23a, the N main body portion 22b, the P main body portion 23b, the output main body portion 24b, and the sealing member 25.

Note that the thickness of the N main body portion 22b, the thickness of the P main body portion 23b, and the thickness of the output main body portion 24b may be different from each other. Even in this case, each of the thickness of the portion from the N connected portion 22a to the P connected portion 23a and the thickness of the sealing member 25 may be equal to or less than the thickness of the N main body portion 22b, the thickness of the P main body portion 23b, or the thickness of the output main body portion 24b.

The second semiconductor device 2 according to the first embodiment includes not only the above constituent elements, but also a signal terminal portion 27 of FIGS. 5A and 5B. The signal terminal portion 27 is connected to the semiconductor elements 21a and 21b by a wire (not illustrated) or the like, and protrudes outward from the side portion of the sealing member 25.

As illustrated in FIGS. 5A and 5B, the N main body portion 22b and the P main body portion 23b are disposed adjacent to each other in the plan view, and the output main body portion 24b is disposed on an opposite side to the N main body portion 22b and the P main body portion 23b with respect to the sealing member 25 in the plan view. However, the positional relationship between the N main body portion 22b, the P main body portion 23b, the output main body portion 24b, and the signal terminal portion 27 in the plan view is not limited to the positional relationship illustrated in FIGS. 5A and 5B.

Figure 8:
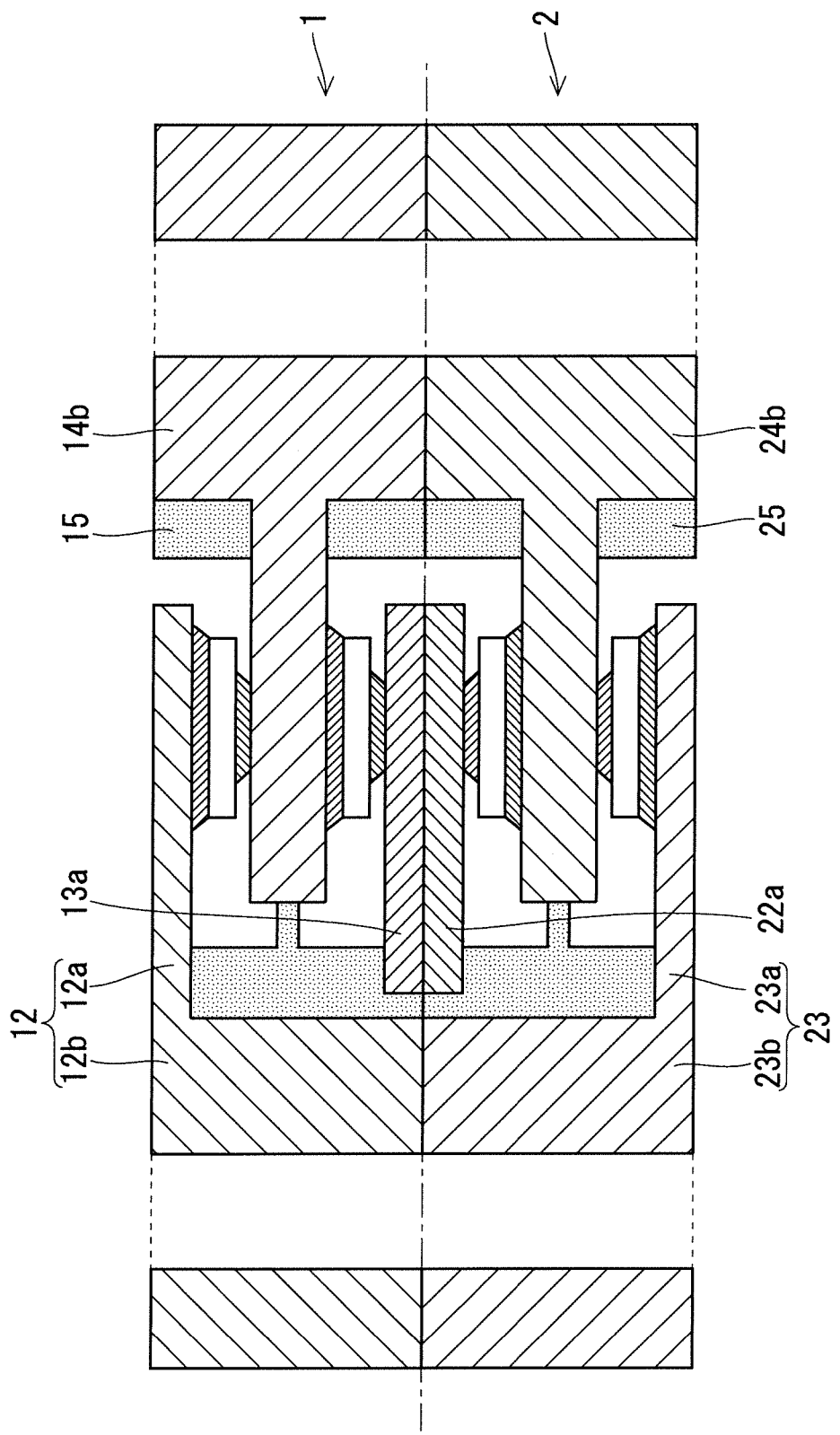
FIG. 8 is a cross-sectional view illustrating a configuration in which one first semiconductor device and one second semiconductor device are bonded according to the first embodiment.

FIG. 8 is a cross-sectional view illustrating a configuration in which the first semiconductor device 1 and the second semiconductor device 2 according to the first embodiment are bonded, and FIGS. 9A and 9B are side views illustrating the configuration. Note that in the following description, when the P main electrodes 12 and 23 and the N main electrodes 13 and 22 are not differentiated from each other, they may be referred to as the "main electrodes".

The N main electrode 13 of the first semiconductor device 1 and the N main electrode 22 of the second semiconductor device 2 overlap one another in the plan view, and further, are electrically connected by being in direct contact with each other.

A part of the P main electrode 12 of the first semiconductor device 1 and a part of the P main electrode 23 of the second semiconductor device 2 overlap one another in the plan view, and further, are electrically connected by being in direct contact with each other. Here, the part of the P main electrode 12 is the P main body portion 12b, and the part of the P main electrode 23 is the P main body portion 23b.

A part of the output terminal 14 of the first semiconductor device 1 and a part of the output terminal 24 of the second semiconductor device 2 overlapped one another in the plan view, and further, are electrically connected by being in direct contact with each other. Here, the part of the output terminal 14 is the output main body portion 14b, and the part of the output terminal 24 is the output main body portion 24b.

Two 2-in-1 modules are connected in parallel to realize a 4-in-1 module by the configuration in which the first semiconductor device 1 and the second semiconductor device 2 are bonded as described above. Note that in the first embodiment, the electrode and the output terminal of the first semiconductor device 1 are electrically connected to the electrode and the output terminal of the second semiconductor device 2 by direct contact, however the present invention is not limited hereto. For example, like in a fifth embodiment and the like to be described later, an electrode and an output terminal of the first semiconductor device 1 and an electrode and an output terminal of the second semiconductor device 2 may be electrically connected by a metal plate or the like interposed therebetween.

In addition, while the configuration including one first semiconductor device 1 and one second semiconductor device 2 has been described in the above description, the configuration may include one or more first semiconductor devices 1 and one or more second semiconductor devices 2 in which the first semiconductor device 1 and the second semiconductor device 2 are alternately bonded one by one. For example, as illustrated in FIG. 10, the configuration may be one in which one second semiconductor device 2 is interposed between two first semiconductor devices 1.

Figure 10:
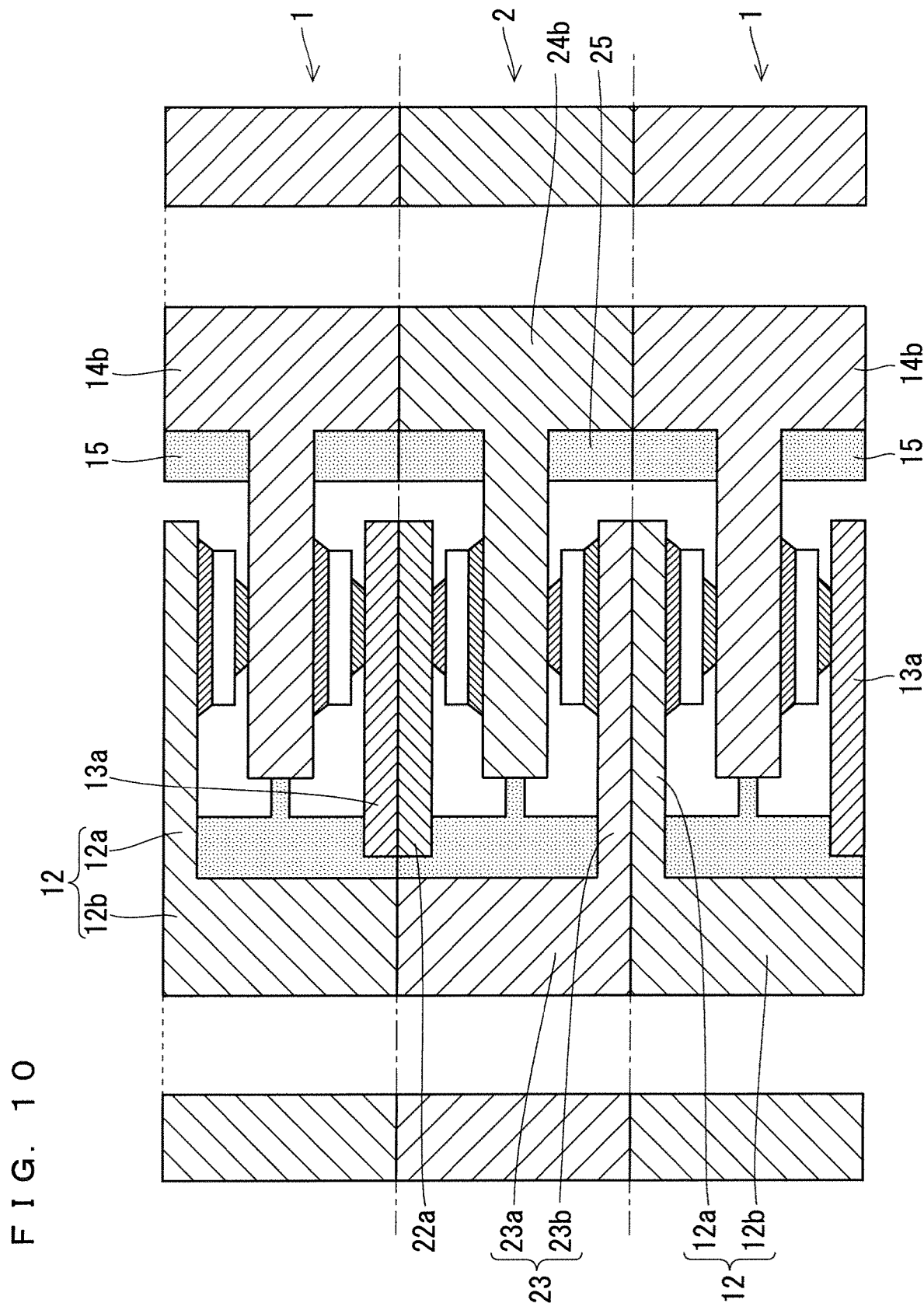
FIG. 10 is a cross-sectional view illustrating a configuration in which two first semiconductor devices and one second semiconductor device are bonded according to the first embodiment.

In FIG. 10, the N main electrode 13, a part of the P main electrode 12, and a part of the output terminal 14 of the uppermost first semiconductor device 1, and the N main electrode 22, a part of the P main electrode 23, and a part of the output terminal 24 of the second semiconductor device 2 each overlap one another in the plan view and further, are electrically connected. Furthermore, the P main electrode 23, a part of the N main electrode 22, and a part of the output terminal 24 of the second semiconductor device 2, and the P main electrode 12, a part of the N main electrode 13, and a part of the output terminal 14 of the lowermost first semiconductor device 1 each overlap one another in the plan view and further, are electrically connected. Accordingly, three 2-in-1 modules are connected in parallel to realize a 6-in-1 module.

Summary of First Embodiment

According to the semiconductor device according to the first embodiment as described above, additional semiconductor elements can be connected in parallel by bonding the first semiconductor device 1 and the second semiconductor device together. Furthermore, since the main electrodes connected to an external unit such as a power supply, a motor, or the like are also bonded, it can cope with an increase in current and an increase in Joule heat following the additional parallel connection, and by making it easy to position (align) and fix the main electrode, ease of assembly is improved. In addition, since the gap between the first semiconductor device 1 and the second semiconductor device 2 that are bonded can be reduced, including that a gap between the main electrodes having the same potential can be reduced, and the like, it is possible to simplify the ease of assembly of the semiconductor device and miniaturize the semiconductor device.

Second Embodiment

Figure 11:
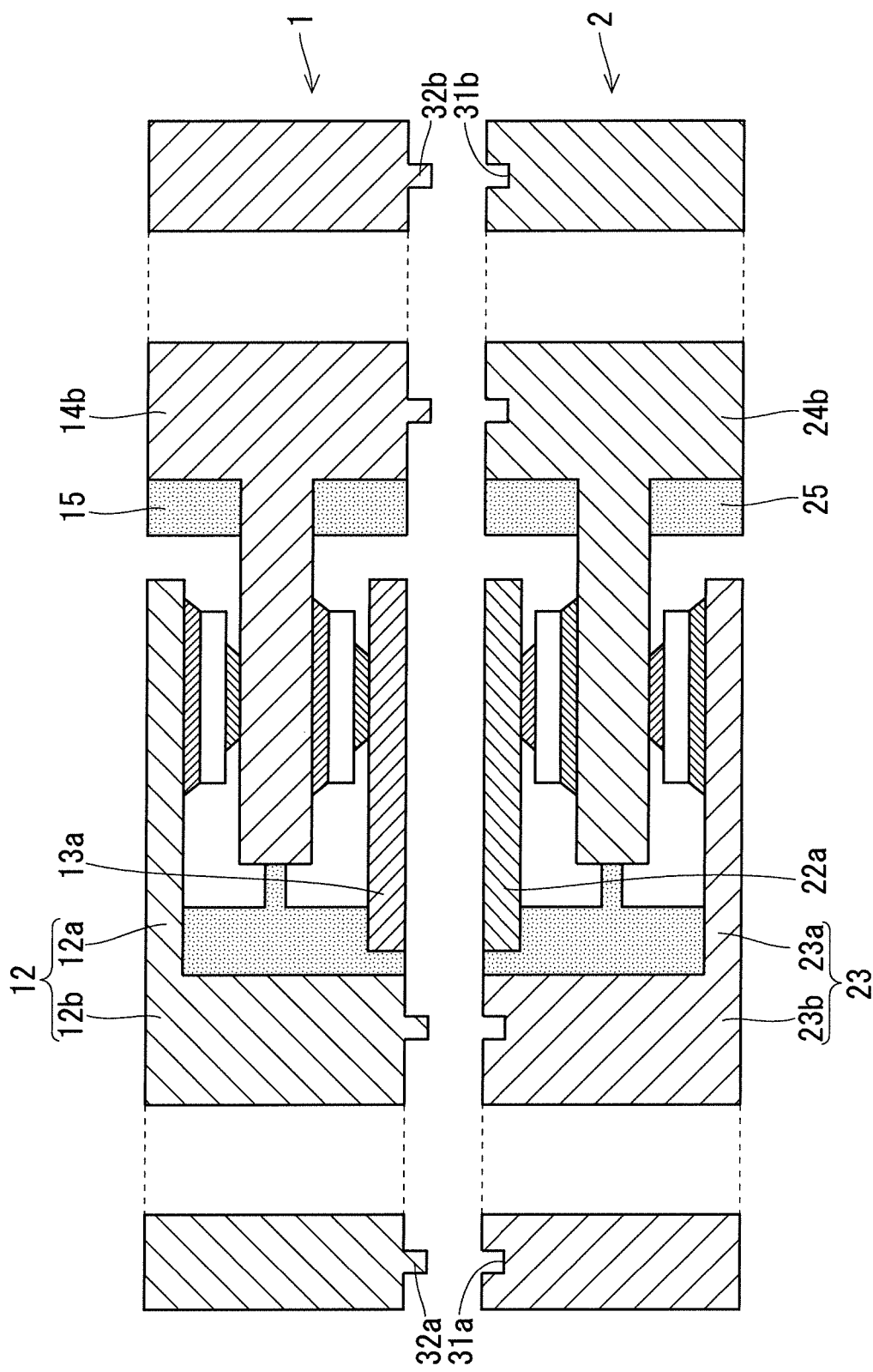
FIG. 11 is a cross-sectional view illustrating configurations of a first semiconductor device and a second semiconductor device according to a second embodiment.

FIG. 11 is a cross-sectional view illustrating configurations of the first semiconductor device 1 and the second semiconductor device 2 according to a second embodiment. Hereinafter, portions of the configurations of the second embodiment that differ from the configuration of the first embodiment will mainly be described.

In FIG. 11, a concave portion 31a is disposed on at least one of the N main electrode 22 and the P main electrode 23 of the second semiconductor device 2, and a convex portion 32a fitting with the concave portion 31a is disposed on at least one of the N main electrode 13 and the P main electrode 12 of the first semiconductor device 1. Furthermore, in FIG. 11, a concave portion 31b is disposed in the output terminal 24 of the second semiconductor device 2, and a convex portion 32b fitting with the concave portion 31b is disposed on the output terminal 14 of the first semiconductor device 1.

Note that, contrary to the configuration of FIG. 11, a concave portion may be disposed on at least one of the P main electrode 12 and the N main electrode 13 of the first semiconductor device 1, and a convex portion fitting with the concave portion may be disposed on at least one of the P main electrode 23 and the N main electrode 22 of the second semiconductor device 2. In addition, the above concave portion and convex portion may be a plurality of minute irregularities, or they may have a serrated shape.

According to the semiconductor device according to the second embodiment as described above, it is possible to realize improvement in positioning (alignment) when bonding the first semiconductor device and the second semiconductor device 2 and improvement in heat conductivity due to an increase in a contact area between the main electrodes. In addition, when greases are disposed between the main electrodes, the contact area between the main electrodes and the greases can be increased, therefore heat conductivity can be improved.

Third Embodiment

Figure 12:
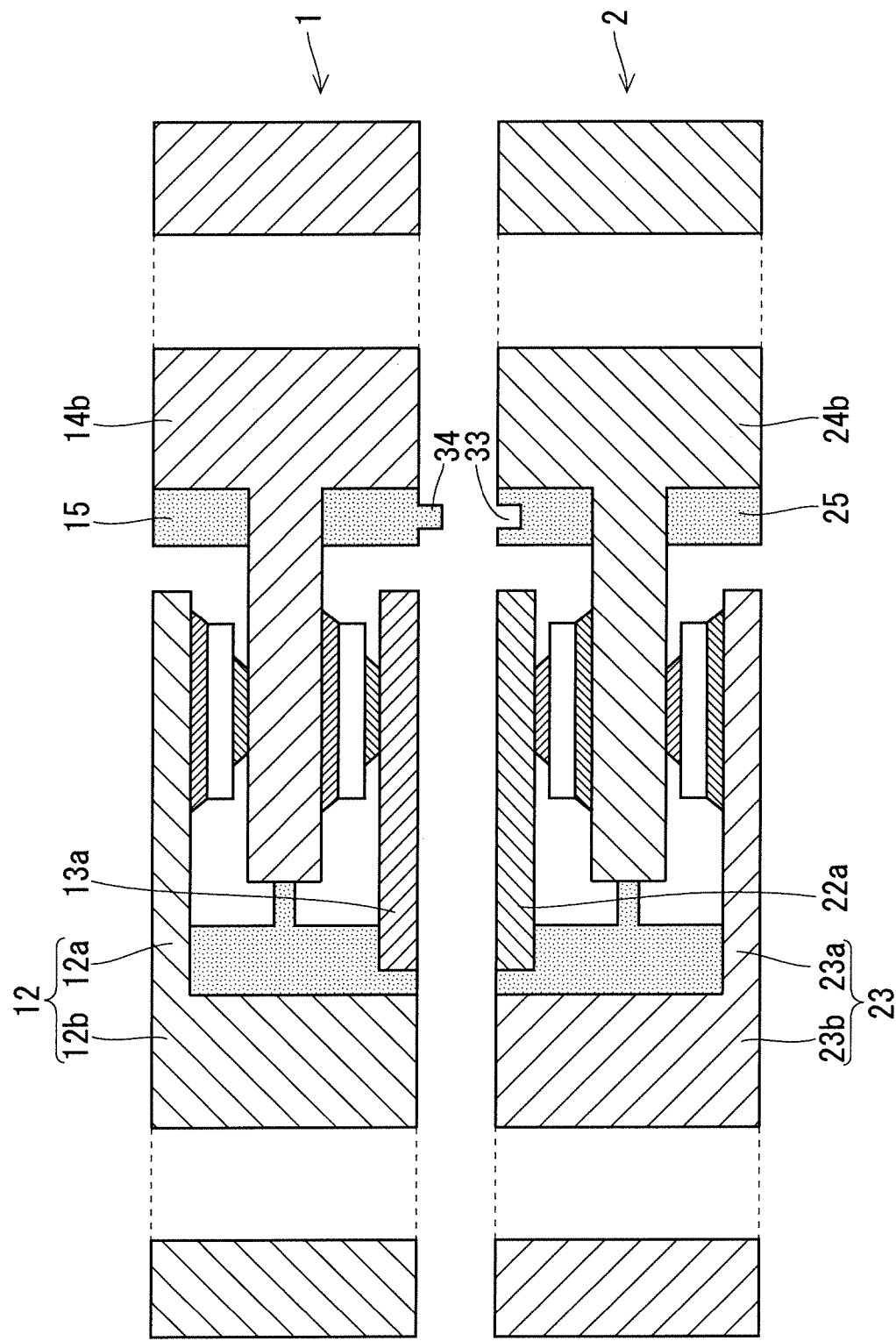
FIG. 12 is a cross-sectional view illustrating configurations of a first semiconductor device and a second semiconductor device according to a third embodiment.

FIG. 12 is a cross-sectional view illustrating configurations of the first semiconductor device 1 and the second semiconductor device 2 according to a third embodiment. Hereinafter, portions of the configurations of the third embodiment that differ from the configuration of the first embodiment and the second embodiment will mainly be described.

In the third embodiment, a first positioning portion capable of positioning (aligning) the first semiconductor device 1 and the second semiconductor device 2 is disposed in each of the sealing members 15 and 25 of the first semiconductor device 1 and the second semiconductor device 2. The first positioning portion may be, for example, a concave portion and a convex portion as illustrated in FIG. 12, or it may be a screw hole or a groove (not illustrated). Note that, while in the example of FIG. 12, the concave portion 33, which is the first positioning portion, is disposed on the sealing member 25, and the convex portion 34, which is the first positioning portion, is disposed on the sealing member 15, the concave portion may be provided on the sealing member 15, and the convex portion may be provided on the sealing member 25.

According to the semiconductor device according to the third embodiment as described above, it is possible to improve positioning (alignment) when bonding the first semiconductor device 1 and the second semiconductor device 2.

Fourth Embodiment

Figure 13:
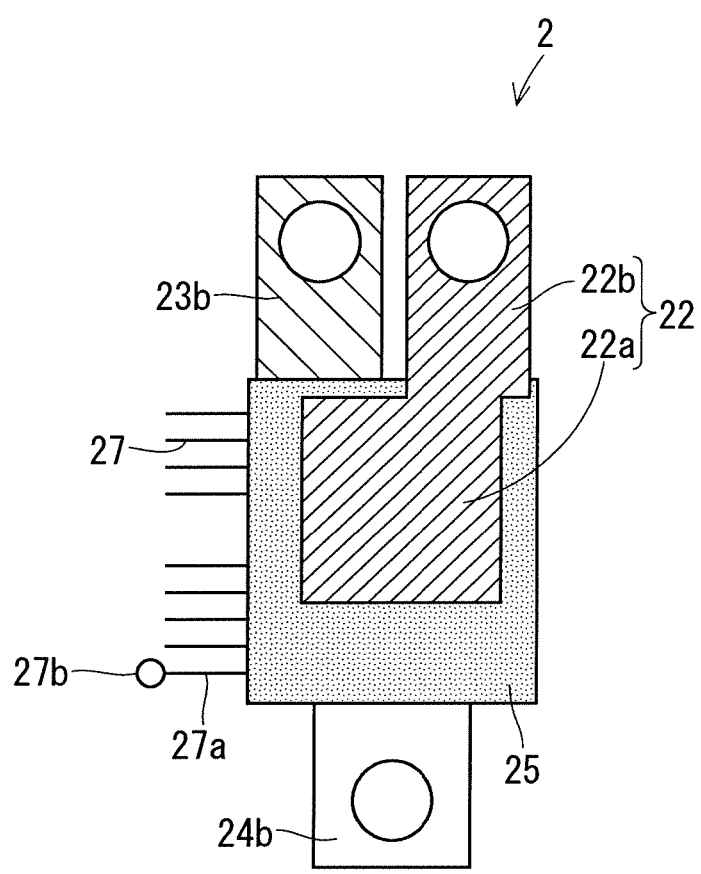
FIG. 13 is a plan view illustrating a configuration of a second semiconductor device according to a fourth embodiment.

FIG. 13 is a plan view illustrating a configuration of the second semiconductor device 2 according to a fourth embodiment. The second semiconductor device 2 according to the fourth embodiment includes not only the constituent elements described in the first embodiment to the third embodiment, but also a dummy portion 27a of the signal terminal portion 27.

The dummy portion 27a protrudes outward from the side portion of the sealing member 25 in the same way as the signal terminal portion 27. Also, the dummy portion 27a is provided with a second positioning portion capable of positioning (aligning) the first semiconductor device 1 and the second semiconductor device 2. In the example of FIG. 13, an annular portion 27b, which is a second positioning portion, is disposed in the dummy portion 27a of the second semiconductor device 2. Note that, although not illustrated, the first semiconductor device 1 also includes a same dummy portion as the dummy portion 27a, and an annular portion, which is a second positioning portion, is disposed in the dummy portion.

According to the semiconductor device according to the fourth embodiment as described above, it is possible to improve positioning (alignment) when bonding the first semiconductor device and the second semiconductor device 2.

Fifth Embodiment

In the first embodiment to the fourth embodiment, a metal plate including copper (Cu) may be disposed between the first semiconductor device 1 and the second semiconductor device 2. For example, the metal plate is patterned to maintain an electrical connection between the P main electrodes 12 and 23, an electrical connection between the N main electrodes 13 and 22, and an electrical connection between the output terminals 14 and 24, while maintaining insulation between these three electrical connections.

According to such a semiconductor device according to the fifth embodiment, heat dissipation and rigidity can be improved.

Sixth Embodiment

In the fifth embodiment, the metal plate disposed between the first semiconductor device 1 and the second semiconductor device 2 may include molybdenum (Mo) instead of Cu. Note that the metal plate may include Mo by including an Mo alloy. According to such a semiconductor device according to a sixth embodiment, rigidity can be further improved. As a result, deformation of the semiconductor device due to heat can be suppressed, therefore reliability of the semiconductor device can be improved.

Seventh Embodiment

Between the first semiconductor device 1 and the second semiconductor device 2 of the first embodiment to the fourth embodiment, a sheet including resin or carbon having higher heat dissipation than the sealing members 15 and 25 may be disposed, greases may be disposed, or the first semiconductor device 1 and the second semiconductor device 2 may be brazed. According to such a configuration, adhesion and heat dissipation can be improved.

Eighth Embodiment

In the first embodiment to the seventh embodiment, the insulating plates 70a and 70b in FIG. 1 may be sheet-like resin insulating plates. According to such a configuration, it is possible to suppress chinks and cracks generated when the insulating plates 70a and 70b are made of ceramic resin, therefore reliability of thermal conduction can be improved.

Ninth Embodiment

Figure 14:
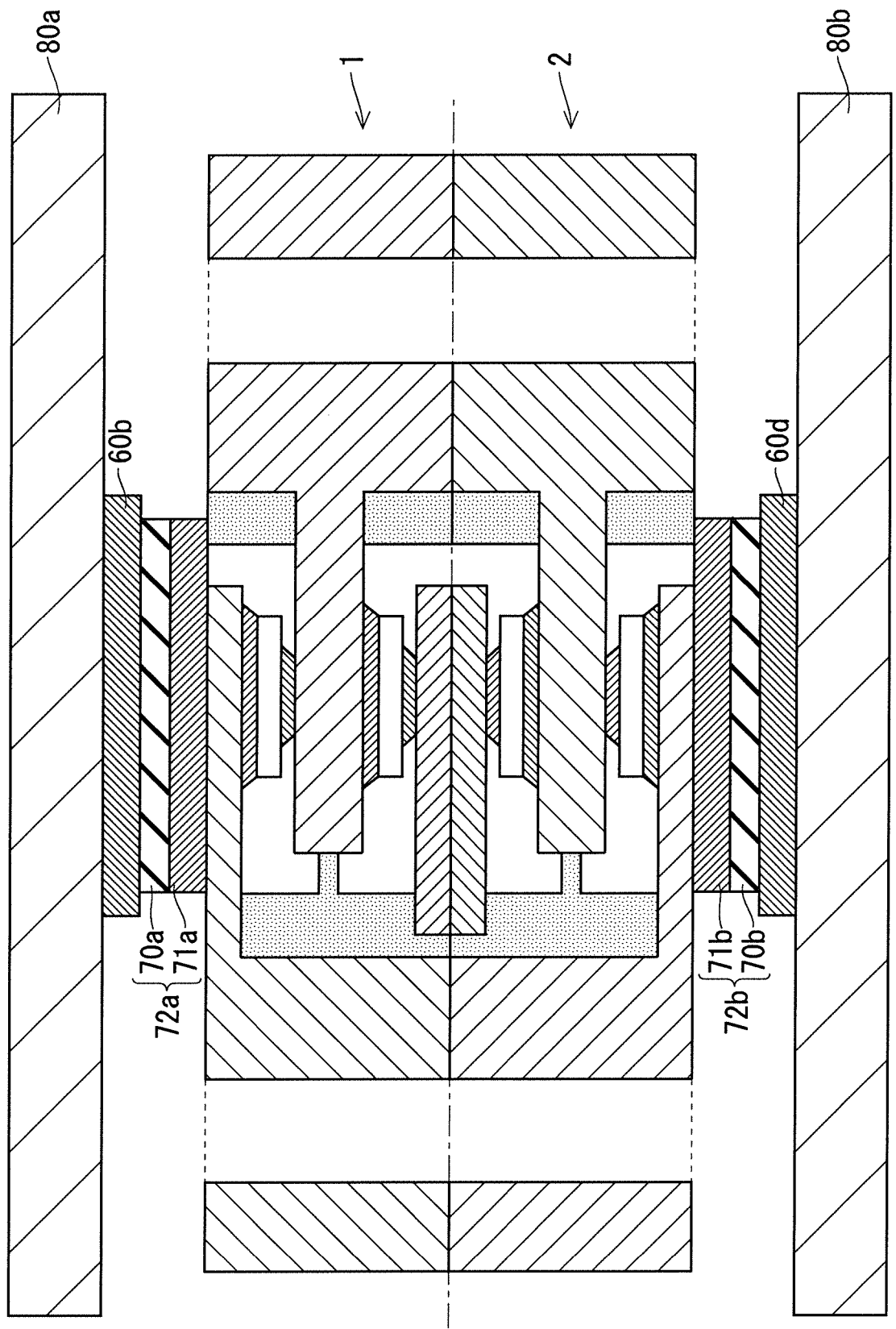
FIG. 14 is a cross-sectional view illustrating a configuration of a semiconductor device according to a ninth embodiment.

FIG. 14 is a cross-sectional view illustrating a configuration of a semiconductor device according to a ninth embodiment. Hereinafter, portions of the configuration of the ninth embodiment that differ from the configuration of the first embodiment to the eighth embodiment will mainly be described.

The semiconductor device according to the ninth embodiment includes circuit boards 72a and 72b.

The circuit board 72a is disposed on the upper surface of the first semiconductor device 1 and the second semiconductor device 2 that are bonded (hereinafter also referred to as a "device bonding structure"). The circuit board 72a includes the insulating plate 70a and a metal plate 71a, and the metal plate 71a is disposed between the insulating plate 70a and the device bonding structure.

Similarly, the circuit board 72b is disposed on the lower surface of the device bonding structure. The circuit board 72b includes the insulating plate 70b and a metal plate 71b, and the metal plate 71b is disposed between the insulating plate 70b and the device bonding structure.

According to such a configuration of the semiconductor device according to the ninth embodiment, not only can the grease between the insulating plates 70a and 70b and the device bonding structure be omitted, but heat dissipation can also be improved.

Tenth Embodiment

Figure 15:
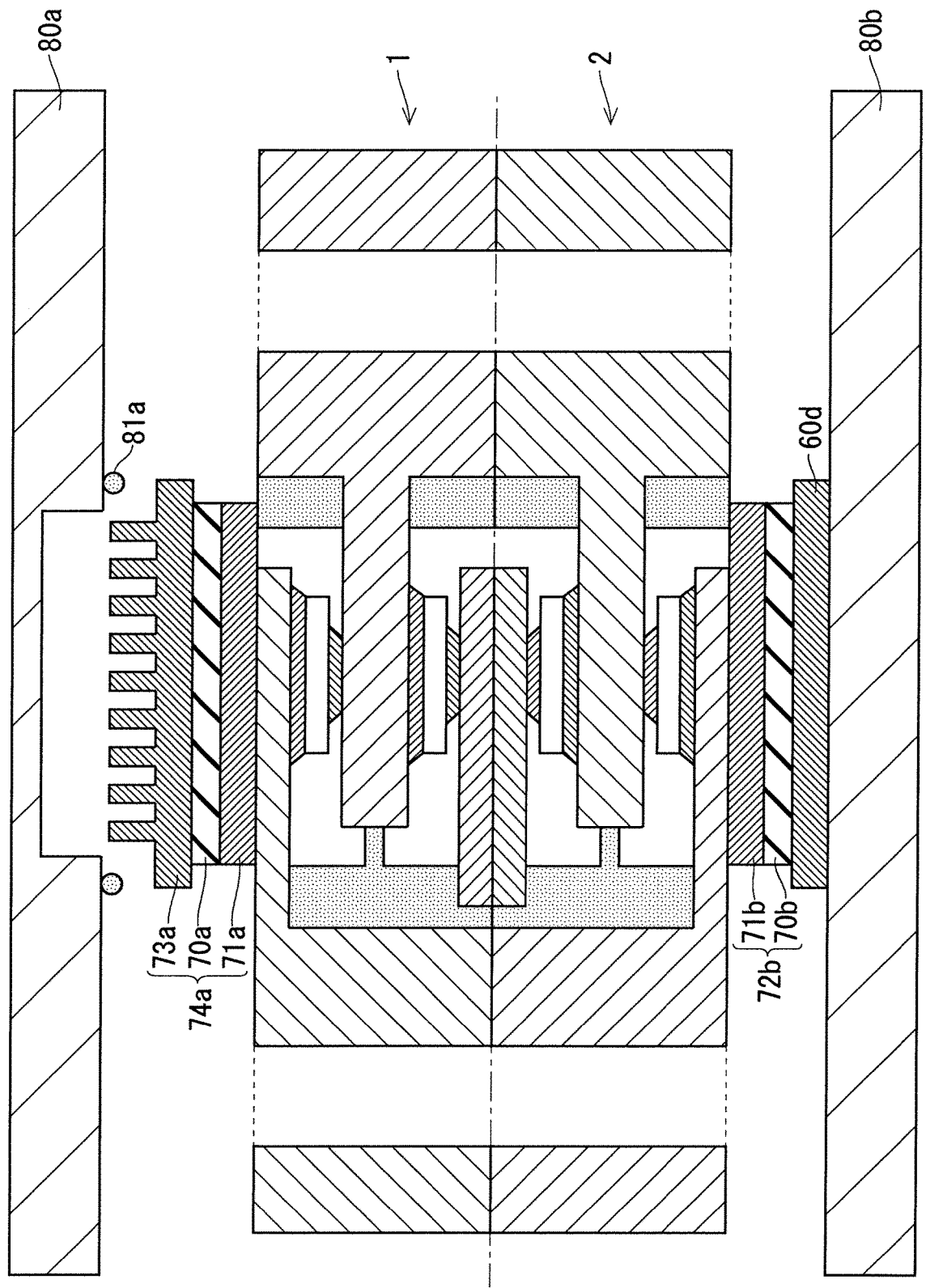
FIG. 15 is a cross-sectional view illustrating a configuration of a semiconductor device according to a tenth embodiment.

FIG. 15 is a cross-sectional view illustrating a configuration of the semiconductor device according to the tenth embodiment. Hereinafter, portions of the configuration of the tenth embodiment that differ from the configuration of the first embodiment to the ninth embodiment will mainly be described.

The semiconductor device according to the tenth embodiment includes a finned circuit board 74a.

The finned circuit board 74a is disposed on an upper surface of the device bonding structure. The finned circuit board 74a includes the same insulating plate 70a and the metal plate 71a as those in the configuration of the ninth embodiment (FIG. 14), and it also includes a fin board 73a disposed on an opposite side to the metal plate 71a with respect to the insulating plate 70a. The cooling fin 80a is combined with the finned circuit board 74a via a sealing component 81a such as an O-ring, for example.

According to such a configuration of the semiconductor device according to the tenth embodiment, heat dissipation can be improved. Note that, while not illustrated in FIG. 15, the same configuration as the finned circuit board 74a, the cooling fin 80a, and the sealing component 81a may be applied to a lower configuration of the device bonding structure.

Eleventh Embodiment

In the first embodiment to the tenth embodiment, at least one of the semiconductor elements 11a, 11b, 21a, and 21b may include silicon carbide (SiC) or gallium nitride (GaN). According to such a configuration, miniaturization and high efficiency of the semiconductor device can be realized.

Twelfth Embodiment

In the first embodiment to the eleventh embodiment, when the first semiconductor device 1 is disposed on the second semiconductor device 2 such as in FIG. 8, the N main electrode 22 of the second semiconductor device 2 and the N main electrode 13 of the first semiconductor device 1 may be integrated by welding. Contrary to this case, when the second semiconductor device 2 is disposed on the first semiconductor device 1, the P main electrode 12 of the first semiconductor device 1 and the P main electrode 23 of the second semiconductor device 2 may be integrated by welding. According to such a configuration, since a screw or the like for screwing is unnecessary, the number of components required for the semiconductor device can be reduced.

Thirteenth Embodiment

Figures 17A, 17B:
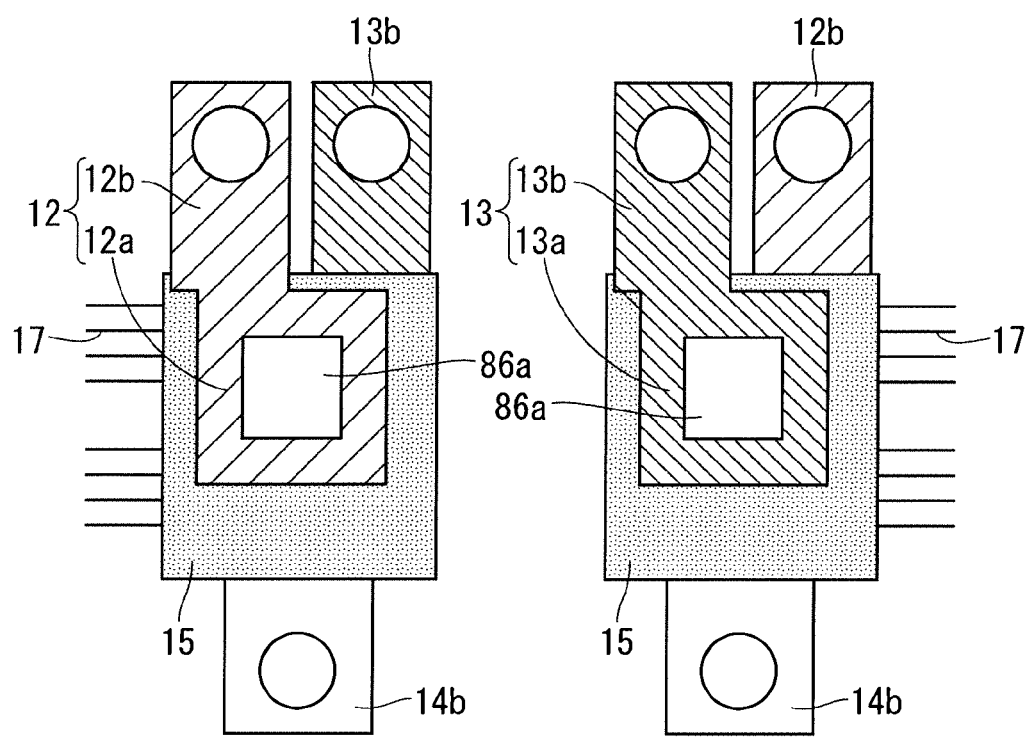
FIGS. 17A and 17B are plan views illustrating a configuration of the first semiconductor device according to the thirteenth embodiment.

FIG. 16 is a cross-sectional view illustrating a configuration of the first semiconductor device 1 according to a thirteenth embodiment, and FIGS. 17A and 17B are plan views illustrating the configuration. In FIG. 16, the semiconductor element and the like are not illustrated for convenience. FIG. 17A plan view of the first semiconductor device 1 as viewed from the upper surface, and FIG. 17B plan view of the first semiconductor device 1 as viewed from the lower surface. Hereinafter, portions of the configuration of the thirteenth embodiment that differ from the configurations of the first embodiment to the twelfth embodiment will mainly be described.

In the thirteenth embodiment, a through hole 86a extending in the vertical direction is provided in the sealing member 15 of the first semiconductor device 1. In addition, a shape of the through hole 86a in the plan view is not limited to a quadrangle shape as is illustrated in FIGS. 17A and 17B, and may be, for example, another polygon shape, or it may be a circle.

Such a semiconductor device according to the thirteenth embodiment can improve heat dissipation. Note that, in the above description, the sealing member 15 of the first semiconductor device 1 has been provided with the through hole 86a extending in the vertical direction, but the present invention is not limited hereto. For example, a through hole extending in the vertical direction may be provided in at least one of the sealing member 15 of the first semiconductor device 1 and the sealing members 25 of the second semiconductor device 2.

Fourteenth Embodiment

Figure 18:
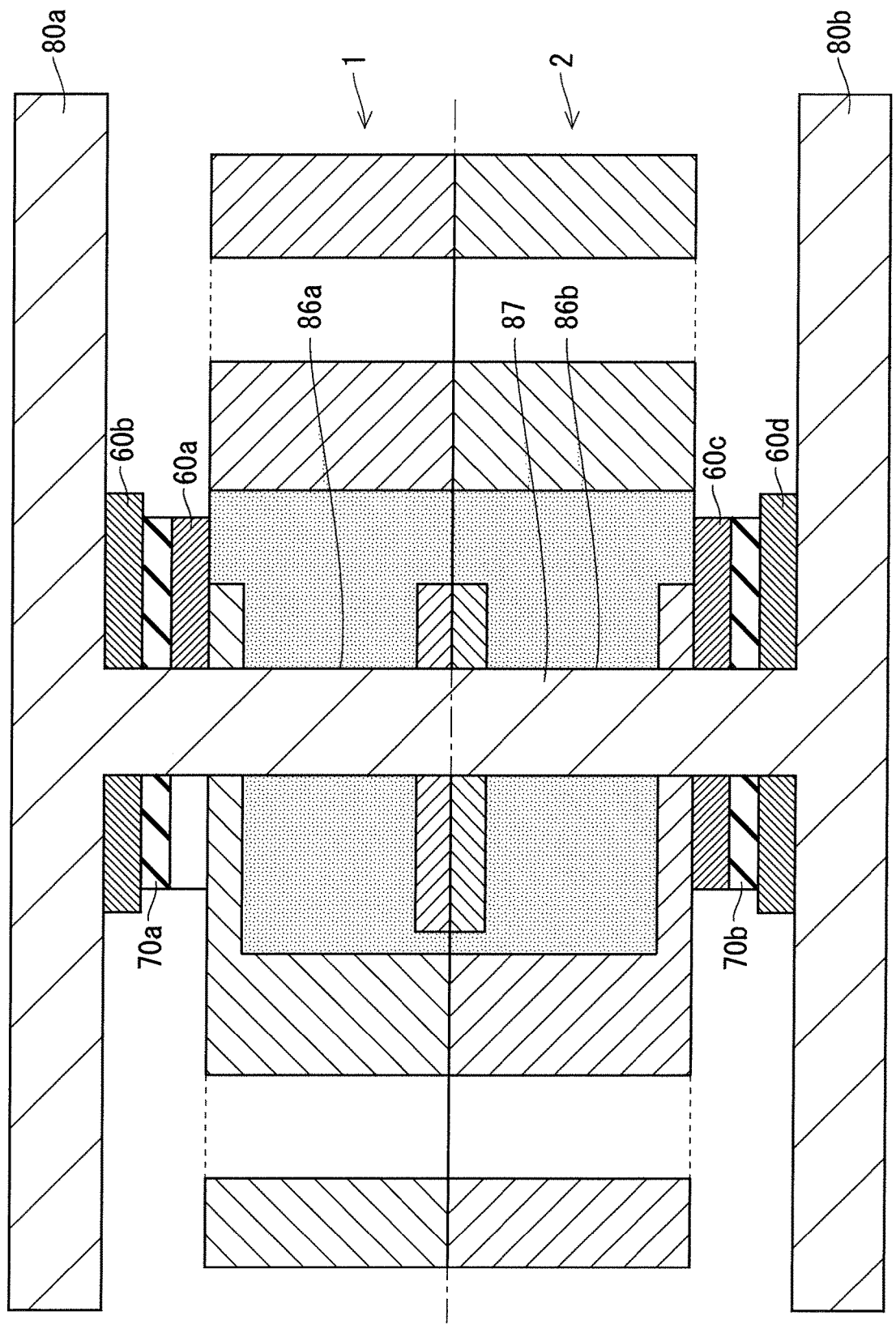
FIG. 18 is a cross-sectional view illustrating a configuration of a semiconductor device according to a fourteenth embodiment.

FIG. 18 is a cross-sectional view illustrating a configuration of the semiconductor device according to the fourteenth embodiment. In FIG. 18, the semiconductor element and the like are not illustrated for convenience, as in FIG. 16. Hereinafter, portions of the configuration of the fourteenth embodiment that differ from the configuration of the thirteenth embodiment will mainly be described.

Similarly to the thirteenth embodiment, in the fourteenth embodiment, the sealing member 15 of the first semiconductor device 1 is provided with the through hole 86a extending in the vertical direction. Furthermore, the sealing member 25 of the second semiconductor device 2 is also provided with a through hole 86b extending in the vertical direction.

Moreover, the semiconductor device according to the fourteenth embodiment includes a fitting member 87 fitting with the through hole 86a of the first semiconductor device 1 and the through hole 86b of the second semiconductor device 2. The fitting member 87 may be a metal member having an insulation treated surface, or it may be an insulating member. According to such a configuration, it is possible to improve positioning (alignment) when bonding the first semiconductor device and the second semiconductor device 2.

Furthermore, as illustrated in FIG. 18, the fitting member 87 may be capable of being fastened to the cooling fins 80a and 80b, or it may be integrated therewith. According to such a configuration, when the fitting member 87 is a metal member having an insulation treated surface or the like, heat dissipation can be improved.

Fifteenth Embodiment

Figure 19:
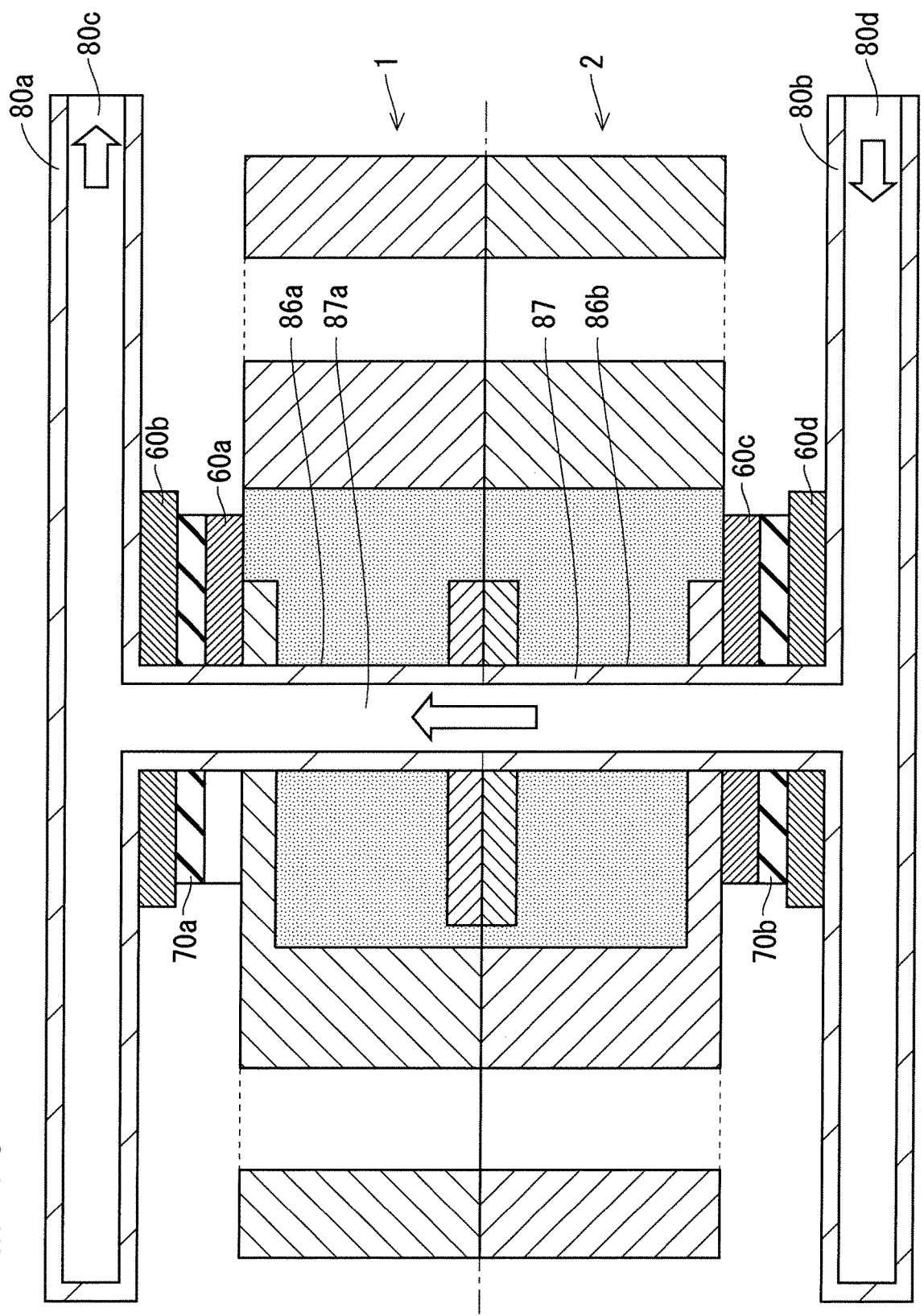
FIG. 19 is a cross-sectional view illustrating a configuration of a semiconductor device according to a fifteenth embodiment.

FIG. 19 is a cross-sectional view illustrating a configuration of a semiconductor device according to the fifteenth embodiment. In FIG. 19, the semiconductor element and the like are not illustrated for convenience, as in FIG. 16. Hereinafter, portions of the configuration of the fifteenth embodiment that differ from the configuration of the fourteenth embodiment will mainly be described.

In the fifteenth embodiment, a space 87a through which a refrigerant such as cooling water or the like passes is provided inside the fitting member 87. For example, an insulating pipe or the like is used as such a fitting member 87. In FIG. 19, an example of a travel direction of the refrigerant is illustrated by an arrow. According to such a configuration, heat dissipation can be improved. Note that, as illustrated in FIG. 19, the cooling fins 80a and 80b may be provided with spaces 80c and 80d that connect with the space 87a of the fitting member 87 and through which refrigerant passes.

Note that each embodiment can be freely combined with each modification example, and each embodiment and each modification example can be modified or omitted as appropriate.

The above description is intended to be illustrative and not restrictive in all aspects. It is understood that numerous modification examples not illustrated are possible.

EXPLANATION OF REFERENCE SIGNS

1: first semiconductor device
2: second semiconductor device
11a, 11b, 21a, 21b: semiconductor element
12, 23: P main electrode
12a, 23a: P connected portion
12b, 23b: P main body portion
13, 22: N main electrode
13a, 22a: N connected portion
13b, 22b: N main body portion
14, 24: output terminal
14a, 24a: output connected portion
14b, 24b: output main body portion
15, 25: sealing member
27: signal terminal portion
27a: dummy portion
27b: annular portion
31a, 33: concave portion
32a, 34: convex portion
60a, 60c: grease
70a, 70b: insulating plate
71a, 71b: metal plate
72a, 72b: circuit board
73a: finned circuit board
80a, 80b: cooling fin
81a: sealing component
86a, 86b: through hole
87: fitting member
87a: space

The invention claimed is:

1. A semiconductor device comprising
a first semiconductor device and a second semiconductor device capable of being bonded, wherein
each of the first semiconductor device and the second semiconductor device includes
a semiconductor element,
a first electrode having a first connected portion disposed on a first side in a vertical direction, which is a bonding direction of the first semiconductor device and the second semiconductor device, with respect to the semiconductor element, and connected to the semiconductor element, and a first main body portion disposed laterally of the semiconductor element and connected to the first connected portion,
a second electrode having a second connected portion disposed on a second side in the vertical direction with respect to the semiconductor element and connected to the semiconductor element, and a second main body portion disposed laterally of the semiconductor element and connected to the second connected portion, and
a holding member that holds the semiconductor element, the first electrode, and the second electrode, and exposes a surface of the first electrode on the first side and a surface of the second electrode on the second side,
at least one of a pair of the first electrode of the first semiconductor device and the second electrode of the second semiconductor device, and a pair of the second electrode of the first semiconductor device and the first electrode of the second semiconductor device is electrically connected, and for each of the first semiconductor device and the second semiconductor device, each of a thickness of a portion from the first connected portion to the second connected portion and a thickness of the holding member are equal to or less than a thickness of the first main body portion or a thickness of the second main body portion.

2. The semiconductor device according to claim 1, wherein each of the first semiconductor device and the second semiconductor device further includes an output terminal having a third connected portion connected to the semiconductor element and a third main body portion disposed laterally of the semiconductor element and connected to the third connected portion, the output terminal of the first semiconductor device and the output terminal of the second semiconductor device are electrically connected, and for each of the first semiconductor device and the second semiconductor device, each of a thickness of a portion from the first connected portion to the second connected portion and a thickness of the holding member are equal to or less than a thickness of the first main body portion, a thickness of the second main body portion, or a thickness of the third main body portion.

3. The semiconductor device according to claim 2, wherein for each of the first semiconductor device and the second semiconductor device, there is no difference in level between surfaces of each of the first connected portion, the first main body portion, the second main body portion, the third main body portion, and the holding member on the first side, and there is no difference in level between surfaces of each of the second connected portion, the first main body portion, the second main body portion, the third main body portion, and the holding member on the second side.

4. The semiconductor device according to claim 1, wherein a concave portion is provided on at least one of the first electrode and the second electrode of one of the first semiconductor device and the second semiconductor device, and a convex portion fitting with the concave portion is provided on at least one of the first electrode and the second electrode of the other of the first semiconductor device and the second semiconductor device.

5. The semiconductor device according to claim 1, wherein a first positioning portion capable of positioning the first semiconductor device and the second semiconductor device is disposed on the holding member of each of the first semiconductor device and the second semiconductor device.

6. The semiconductor device according to claim 1, wherein each of the first semiconductor device and the second semiconductor device further includes a dummy portion of a signal terminal portion that protrudes outward from a side portion of the holding member, and a second positioning portion capable of positioning the first semiconductor device and the second semiconductor device is disposed on the dummy portion of each of the first semiconductor device and the second semiconductor device.

7. The semiconductor device according to claim 1, wherein a metal plate is disposed between the first semiconductor device and the second semiconductor device.

8. The semiconductor device according to claim 7, wherein the metal plate includes Cu or Mo.

9. The semiconductor device according to claim 1, wherein between the first semiconductor device and the second semiconductor device, a sheet including resin or carbon having higher heat dissipation than the holding member is disposed, or a grease is disposed, or the first semiconductor device and the second semiconductor device are brazed.

10. The semiconductor device according to claim 1, further comprising a sheet-like resin insulating plate disposed on at least one of a surface on the first side and a surface on the second side of the first semiconductor device and the second semiconductor device that are bonded, via grease.

11. The semiconductor device according to claim 1, further comprising a circuit board including an insulating plate and a metal plate and disposed on at least one of a surface on the first side and a surface on the second side of the first semiconductor device and the second semiconductor device that are bonded.

12. The semiconductor device according to claim 1, further comprising:

a finned circuit board disposed on at least one of a surface on the first side and a surface on the second side of the first semiconductor device and the second semiconductor device that are bonded; and a cooling fin combined with the finned circuit board via a sealing component.

13. The semiconductor device according to claim 1, wherein the semiconductor element includes SiC or GaN.

14. The semiconductor device according to claim 1, wherein at least one of a pair of the first electrode of the first semiconductor device and the second electrode of the second semiconductor device, and a pair of the second electrode of the first semiconductor device and the first electrode of the second semiconductor device is integrated by welding.

15. The semiconductor device according to claim 1, wherein a through hole extending in the vertical direction is provided on at least one of the holding member of the first semiconductor device and the holding member of the second semiconductor device.

16. The semiconductor device according to claim 15, wherein the through hole is provided on each of the holding member of the first semiconductor device and the holding member of the second semiconductor device, and the semiconductor device further comprises a fitting member fitting with the through hole of the first semiconductor device and the through hole of the second semiconductor device.

17. The semiconductor device according to claim 16, wherein a space through which refrigerant passes is provided inside the fitting member.

* * * * *